(12) United States Patent
Khan et al.

(10) Patent No.: US 7,283,404 B2
(45) Date of Patent: Oct. 16, 2007

(54) CONTENT ADDRESSABLE MEMORY INCLUDING A DUAL MODE CYCLE BOUNDARY LATCH

(75) Inventors: Masood Ahmed Khan, Cedar Park, TX (US); Michael Ju Hyeok Lee, Austin, TX (US); Ed Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 11/055,830

(22) Filed: Feb. 11, 2005

(65) Prior Publication Data
US 2006/0181910 A1    Aug. 17, 2006

(51) Int. Cl.
*G11C 16/04* (2006.01)

(52) U.S. Cl. ............... 365/189.05; 365/201; 365/233; 327/202; 714/726

(58) Field of Classification Search ............. 365/201, 365/189.05, 233; 327/199–203, 208–213, 327/218; 714/726–727, 729
See application file for complete search history.

(56) References Cited

U.S. PATENT DOCUMENTS

| | | | |
|---|---|---|---|
| 4,618,968 A | 10/1986 | Sibigtroth | |
| 4,723,224 A | 2/1988 | Van Hulett et al. | |
| 5,257,223 A * | 10/1993 | Dervisoglu | 365/154 |
| 5,383,146 A | 1/1995 | Threewitt | |
| 5,689,517 A * | 11/1997 | Ruparel | 714/731 |
| 6,289,414 B1 | 9/2001 | Feldmeier et al. | |
| 6,646,900 B2 | 11/2003 | Tsuda et al. | |
| 6,738,862 B1 | 5/2004 | Ross et al. | |
| 6,744,688 B2 | 6/2004 | Gillingham et al. | |
| 6,839,256 B1 | 1/2005 | Proebsting et al. | |
| 2002/0032681 A1 | 3/2002 | Feldmeier et al. | |

OTHER PUBLICATIONS

Arsovski et al.,"A Ternary Content-Addressable Memory . . . ", IEEE Journal of Solid State Circuits, vol. 38, No. 1, (Jan. 2003).
Berkeley, "EE141 Lecture 19-Sequential Logic" (Fall 2004).
Crunch, "Exploring the Basics of AC Scan". Inovys (c) Jul. 2004.
Defossez, "XAPP202 Xilinx CAM in ATM Applications" (Jan. 2001).
Helwig, et al., "High Speed CAM", IBM Deutschland Entwicklung GmbH (1996).
Krishnamurthy, "Address Translation—Lecture Notes" (Spring 2004).

(Continued)

*Primary Examiner*—David Lam
(74) *Attorney, Agent, or Firm*—Mark E. McBurney; Mark P. Kahler

(57) ABSTRACT

A content addressable memory (CAM) system is disclosed including a dual mode cycle boundary latch (CBL). The CBL includes a master latch coupled to a slave latch. The CBL operates in a high speed functional mode and a lower speed test mode. In the high speed functional mode, input data bypasses the master latch and transports directly to the CBL output via the slave latch. The CBL effectively removes the master latch from the circuit in the high speed functional mode. However, in the lower speed test mode, input test data travels via both the master and slave latches to the CBL output.

6 Claims, 4 Drawing Sheets

OTHER PUBLICATIONS

Krishnamurthy, "Address Translation (cont'd)—Lecture Notes" (Spring 2004).

Music Semiconductors, Application Note AN-N19, "Using The MU9C1965A LANCAM MP For Data Wider Than 128 Bits" (Sep. 1998).

Music Semiconductors, Prelim. Data Sheet—MU9C1965A/L LANCAM MP (Jul. 2002).

Music Semiconductors, Application Brief AB-N6—What is a CAM? (Sep. 1998).

Pagiamtzis, "Content—Addressable Memory Introduction" (c) 1993.

Pagiarrtzis, "Low Power CAM Using Pipelined Hierarchical Search Scheme, IEEE Journal of Solid State Circuits", (Sep. 2004).

Pagiamtzis, Pipelined Match-Lines and Hierarchical Search-Lines for Low Power CAMs, IEEE (Sep. 20003).

Stojanovic, et al., "Comp Analysis of MS Latches", IEEE Journal of Solid State Circuits, vol. 34, No. 4, (Apr. 1999).

* cited by examiner

CONTENT ADDRESSABLE MEMORY INCLUDING A DUAL MODE CYCLE BOUNDARY LATCH

CROSS REFERENCE TO RELATED PATENT APPLICATIONS

This patent application is related to U.S. Pat. No. 7,116,569 entitled "Method and Apparatus For Selecting Operating Characteristics Of A Content Addressable Memory By Using A Compare Mask", inventors Joaquin Hinojosa, Eric Jason Fluhr, Michael Ju Hyeok Lee, Jose Angel Paredes and Ed Seewann, filed Feb. 11, 2005, and assigned to the same assignee, the disclosure of which is incorporated herein by reference in its entirety.

This patent application is related to U.S. Pat. No. 7,167,385 entitled "Method and Apparatus For Controlling The Timing Of Precharge In A Content Addressable Memory System", inventors Yuen H. Chan, Masood Ahmed Khan, Michael Ju Hyeok Lee and Ed Seewann, filed Feb. 11, 2005, and assigned to the same assignee, the disclosure of which is incorporated herein by reference in its entirety.

TECHNICAL FIELD OF THE INVENTION

The disclosures herein relate generally to content addressable memories, and more particularly to cycle boundary latches employed by such memories.

BACKGROUND

A content addressable memory or CAM may be viewed conceptually as a search engine that is fabricated from hardware rather than software. Software search engines, which are algorithmically based, tend to be substantially slower than hardware-based CAMs. CAMs can be formed from arrays of conventional semiconductor memory, for example, static random access memory (SRAM), together with additional comparison circuitry that enables a search operation to finish in a single system clock cycle. One routine search-intensive task that benefits significantly from CAM is the address lookup task performed in routers such as Internet routers. Other typical uses of CAM include caches such as processor caches, translation look aside buffers (TLBs), segment lookaside buffers (SLBs) used in the industry for processor memory management, effective to real address translators (ERATs), database accelerators, and data compression applications.

A conventional CAM is configured as an array of individual CAM core cells. A typical binary CAM core cell supports the storage and searching of binary bits, namely zero or one (0, 1). A single CAM cell stores a binary bit in what is referred to as a "true and complement" data form, meaning a zero will be stored in both a zero state and a complemented one state within the core cell. In contrast, a one will be stored both as a one state and a complemented zero state. Horizontal and vertical rows of NOR-based architecture CAM core cells can be configured to form a large CAM array. In such an array, the CAM size is determined first by the number of horizontal cells which is also called the word size. And second, the CAM size is determined by the vertical cell count which corresponds to the number of words stored and available during a compare operation. In a compare operation, input data, also called compare data, is simultaneously compared against each word stored in the CAM.

CAM core cells include both storage and comparison circuitry. Search lines runs vertically through the CAM cell and broadcast the search data, or compare data, to all CAM cells at the same time. Match lines run horizontally across the array and indicate whether or not the search data matches a particular row's word. In more detail, an activated match line (an active high logic state) indicates a match and a deactivated match line (a low logic state) indicates a mismatch for a particular word corresponding to that match line. These match lines which describe the output of the CAM array are typically coupled to an address lookup memory, for example an RAM array, to provide the actual output match data.

A CAM search operation begins with precharging all match lines high, thus placing all match lines temporarily in the match state. Next, the search lines broadcast the search data in binary vertically simultaneously across all words of the array. Next, each CAM core cell compares its stored single binary data against the bit on its corresponding search lines. Cells with matching data do not affect the corresponding word's match line, but cells with a mismatch pull down the corresponding word's match line. The aggregate result is that the match line of any word having at least one bit mismatch is pulled low. All other match lines remain activated (precharged high). Usually almost all match lines are driven low thus indicating mismatches for the words corresponding to those match lines. Typically, one or a small number of match lines will remain high to indicate a matching word or words. Finally, the match lines that remain high, indicating a match, are used as the input to an address lookup memory (RAM array) that is coupled to the CAM array. The data thus addressed in the address lookup memory is then read from the address lookup memory as output data to provide the ultimate result of the search.

A cycle boundary latch is coupled to the address lookup memory to receive and store the output data. A master slave latch is one type of latch that may be employed as a cycle boundary latch. A master slave cycle boundary latch includes a master latch having an input for receiving data and an output coupled to the input of a slave latch. The CAM system first clocks search result data into the master latch and then into the slave latch. This two step transmission of data through a master slave cycle boundary latch consumes valuable time because the data is clocked through two stages until it finally reaches the output of the slave latch. Cycle boundary latches can be coupled together to form an array of latches for storing multi-bit search result data such as matching words. It is desirable that such arrays of cycle boundary latches be testable to assure that they are performing correctly.

What is needed is a method and apparatus for operating a cycle boundary latch which achieves faster transport of search result data through the latch while permitting testing of the latch performance.

SUMMARY

Accordingly, in one embodiment, a method is disclosed for operating a cycle boundary latch (CBL) that includes providing a master latch coupled to a slave latch. The method also includes transmitting test data from a test data input via the master and slave latches to a CBL output, thus defining a test mode of operation. The method further includes transmitting other data, from another data input, through the CBL to the CBL output via a path that bypasses the master latch, thus defining a functional mode of operation. The other data is transmitted at a speed substantially greater than the test data.

In another embodiment, a cycle boundary latch (CBL) is disclosed that includes a master latch having a master latch input to which test data is supplied. The master latch includes a master latch output. The CBL also includes a switch having a first switch input to which other data is supplied. The switch includes a second switch input that is coupled to the master latch output. The switch also includes a switch output. The CBL further includes a slave latch having a slave latch input that is coupled to the switch output. The slave latch is coupled to a CBL output to provide either test data or the other data thereto. When test data is provided to the CBL output, the CBL is operating in a test mode. However, when the other data is provided to the CBL output, the CBL is operating in functional mode.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
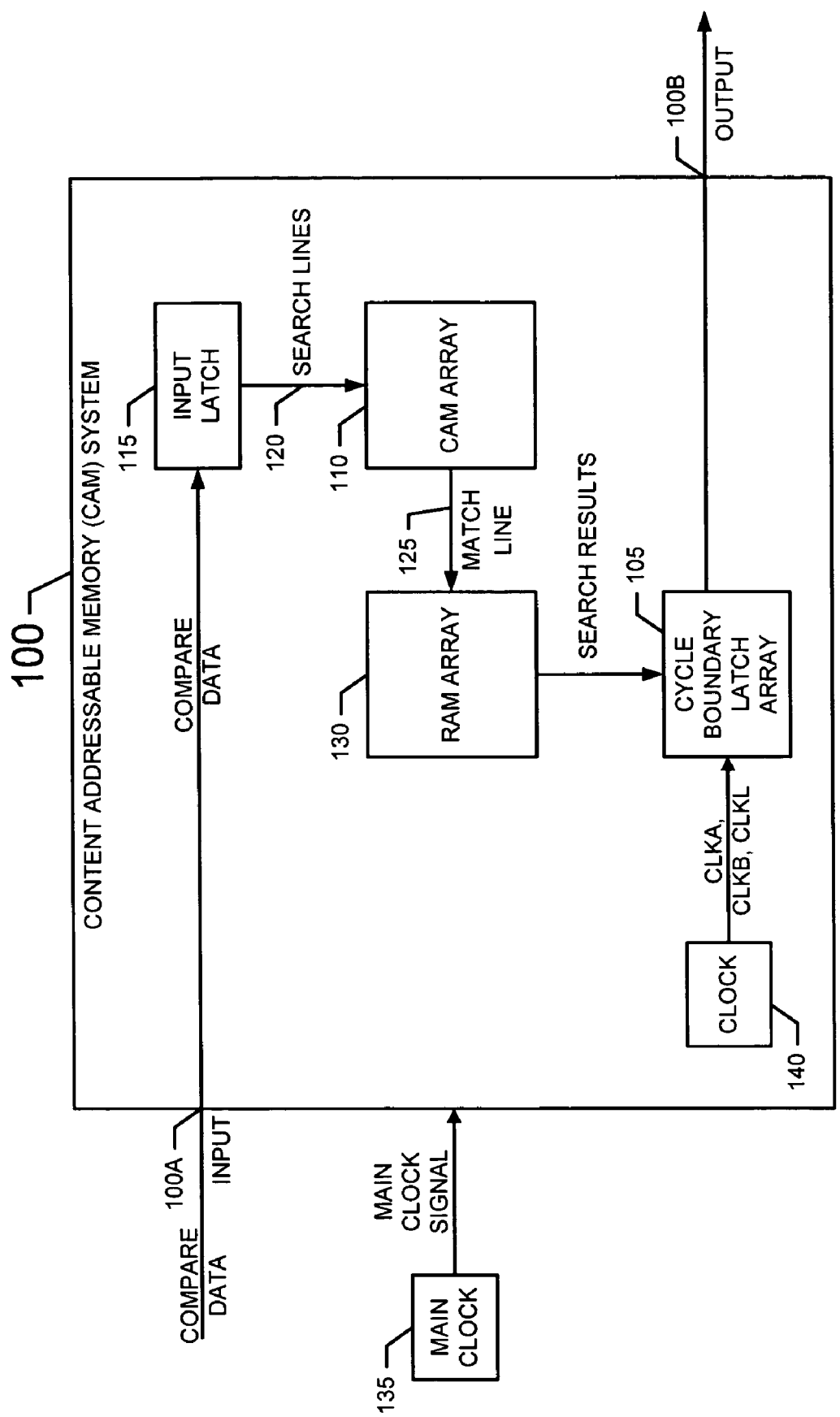
FIG. 1 is a block diagram of a CAM system including the disclosed cycle boundary latch.

FIG. 1 is a block diagram of a CAM system 100 that includes an input 100A and an output 100B. CAM system 100 employs a cycle boundary latch (CBL) array 105 that drives the output 100B of the CAM system. Input 100A receives search data, namely compare data, for which CAM system 100 seeks a match within its CAM array 110. CAM system 100 includes an input latch 115 that couples to input 100A to receive and store the compare data. The compare data includes multiple bits that form a multi-bit word that input latch 115 stores. Input latch 115 supplies the compare data to CAM array 110 via search lines 120. CAM array 110 stores multiple words, each of which may be a match with the compare data. CAM array 110 simultaneously compares the compare data with all words stored therein to determine if a match exists. If CAM array 110 finds a match between the compare data and a word in CAM array 110, then a match line 125 corresponding to that word goes high. Match lines of words that do not match the compare data go low. Match line 125 transmits the location of the match to RAM array 130 which mirrors the words stored in CAM array 110. Thus, RAM array 130 contains all of the possible matching words that CAM array 110 contains. RAM array 130 couples to cycle boundary latch array 105 to provide search results, namely the matching word, to CBL array 105. CBL array 105 includes a sufficient number of cycle boundary latches to store the multiple bits of the search results, namely the matching word supplied by RAM array 130. CBL array 105 provides output to the matching word at CAM system output 100B. A main clock 135 couples to CAM system 100 to provide a main clock signal that controls movement of data among the components of CAM system 100 from input 100A to output 100B. A clock 140 supplies CBL array 105 with the clock signals CLKA, CLKB and CLKL that are shown in the timing diagrams of FIG. 4 as discussed below.

Figure 2:
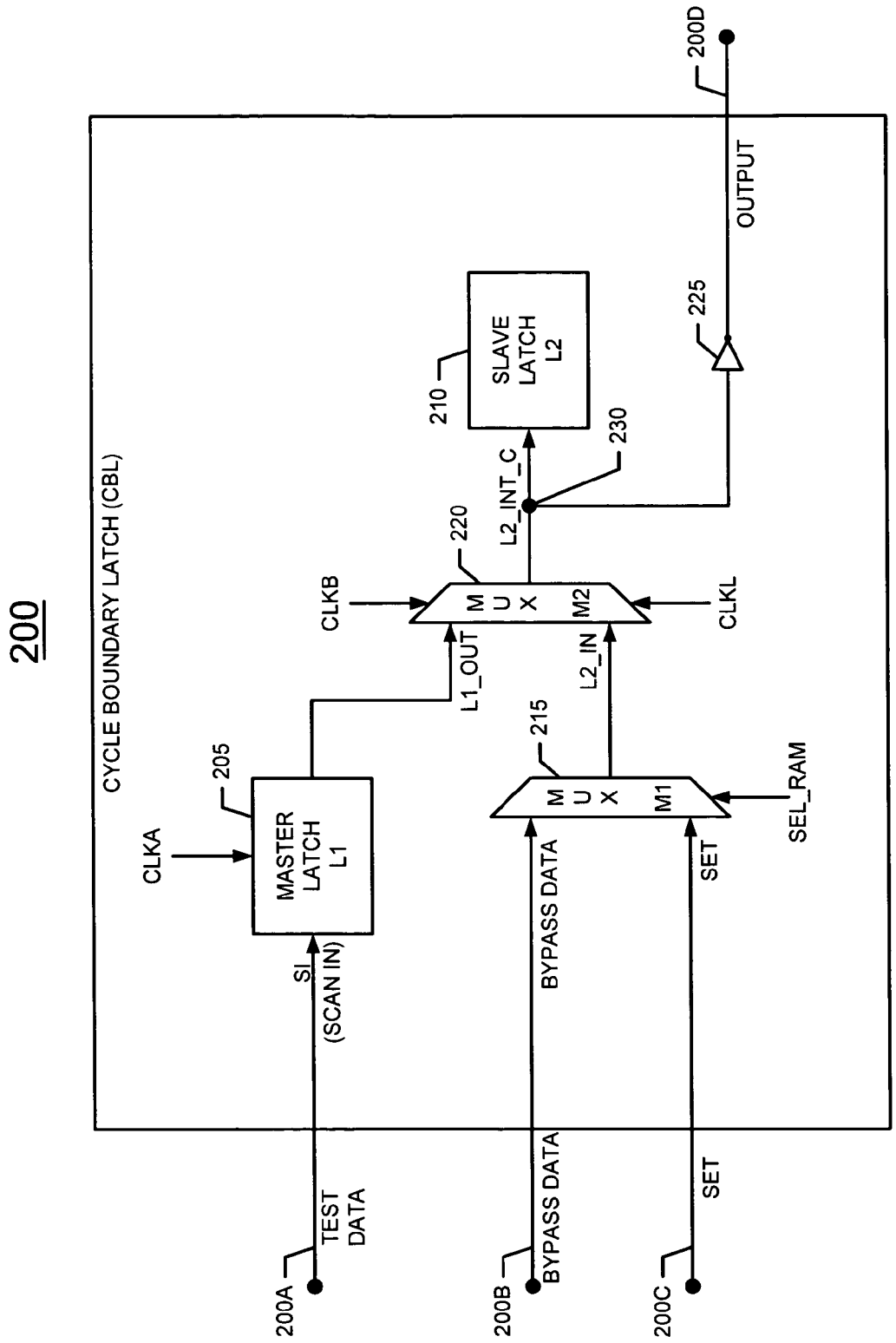
FIG. 2 is a block diagram of the cycle boundary latch employed in the CAM system of FIG. 1.

FIG. 2 shows a block diagram of the disclosed cycle boundary latch (CBL) 200. This particular CBL is a one bit latch that is capable of operating in a functional mode and a test mode. A plurality of cycle boundary latches 200 can be linked together serially to form the CBL array 105 discussed above with reference to FIG. 1. Such a CBL array 105 can receive all of the bits of a multi-bit search result or matching word. For example, 50 cycle boundary latches 200 may be serially linked to form CBL array 105 to receive a 50 bit search result in content addressable memory (CAM) system 100.

CBL 200 is configured as a master-slave latch including a master latch 205, designated L1, and a slave latch 210, designated L2. Master latch 205 includes an SI (scan in) input to which test data is supplied or scanned in when latch 200 operates in a test mode discussed below in more detail. Master latch 205 also includes a CLKA input to which CAM system 100 supplies a CLKA clock signal. Master latch 205 includes an output to which master latch 205 supplies an L1_OUT output signal.

CBL 200 includes a two input multiplexer 215, designated M1, having a SET input and a BYPASS DATA input. Multiplexer 215 acts as a switch. Either the BYPASS DATA input or the SET input can be selected by the select signal, SEL_RAM, provided thereto depending one whether the SEL_RAM signal is high or low. When the SEL_RAM signal is high, multiplexer 215 selects the SET input, whereas when the SEL_RAM signal is low, multiplexer 215 selects the BYPASS DATA input. When CBL 200 operates in test mode, CAM system 100 supplies test data to the SI input of master latch 205. However, when CLB 200 operates in the functional mode, CAM system 100 supplies data to the SET input of multiplexer 215 from RAM array 130, or in the case of a bypass operation, CAM system 100 supplies data to the BYPASS DATA input of multiplexer 215 from the compare data input. In both cases, the test path through master latch 205 is bypassed.

CBL 200 also includes a second multiplexer, namely a two input multiplexer 220, designated M2. The output of master latch 205 couples to the L1_OUT input of multiplexer 220 so that multiplexer 220 receives the L1_OUT signal at one of its inputs. The output of multiplexer 215 couples to the L2_IN input of multiplexer 220 so that the remaining input of multiplexer 220 receives the L2_IN signal at one of its inputs.

Multiplexer 220 includes two clock inputs, CLKB and CLKL, to which CAM system 100 supplies CLKB and CLKL clock signals, respectively. When CLKB is high and CLKL is low, multiplexer 220 allows the L1_OUT signal to pass therethrough to the output of multiplexer 220. However, when CLKB is low and CLKL is high, multiplexer 220 allows the L2_IN signal to pass therethrough to the multiplexer output. The signal thus passed to the multiplexer 220 output is designated L2_INT_C.

Slave latch 210 latches the L2_INT_C output signal. An inverting amplifier 225 couples to a node 230 between the multiplexer 220 output and the slave latch 210 input. While slave latch 210 latches the L2_INT_C output signal, inverting amplifier 225 receives the L2_INT_C signal and drives the L2_INTC_C signal through to latch output 200D.

When operating in test mode, master slave latch 200 transports test data through both master latch 205 and slave latch 210. Thus, master slave latch 200 subjects test data to two stages of delay, namely a delay through master latch 205 and a delay associated with slave latch 210. However, this two stage delay does not present a problem when operating in test mode because speed is generally not important in test mode. In test mode, the designer and user are concerned more with the integrity of the data passed through the master slave latch than speed of transport. However, in sharp contrast, the speed of master slave latch 200 is very important when operating in functional mode, namely the operational mode of the master slave latch 200. When operating in the functional mode, CAM system 100 provides data to either the SET input or the BYPASS DATA input of multiplexer 215. From multiplexer 215, this data is supplied to multiplexer 220 which passes the data directly to its output and to node 230. Once the data is present at node 230, while slave latch 210 is latching the data, inverting amplifier 225 directly outputs the data to output 200D. Thus, when master slave latch 200 operates in functional mode, latch 200 eliminates the delay through master latch 205 by bypassing that path.

Figure 3:
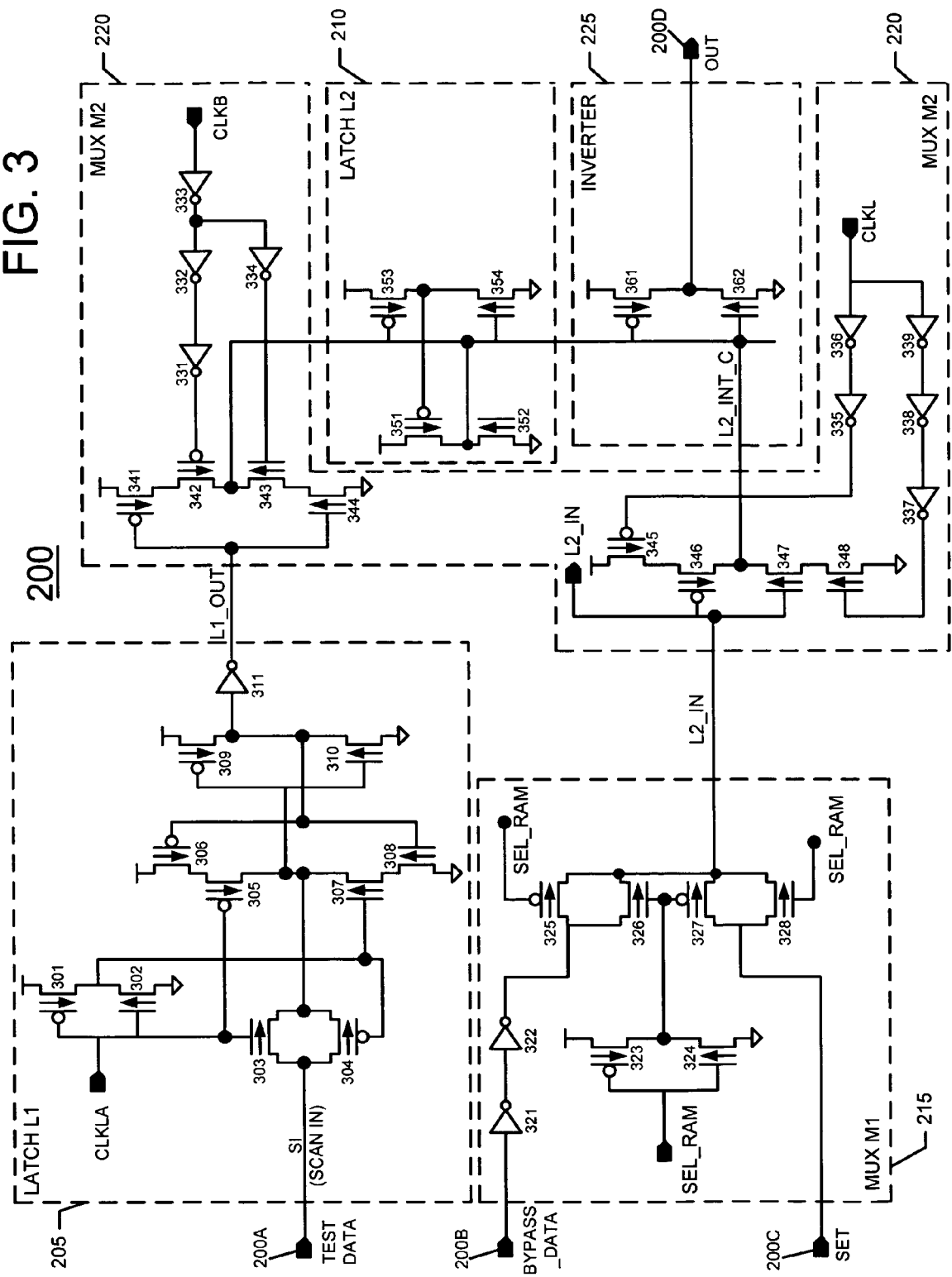
FIG. 3 is a schematic diagram of the cycle boundary latch of FIG. 2.

FIG. 3 shows a schematic diagram of the master slave latch 200 previously shown in block diagram form in FIG. 2. Master slave latch 200 includes scan in (SI) test data input 200A, bypass data input 200B, set input 200C, and output 200D. Master latch 205, namely L1, includes transistors 301-310 and inverting amplifier 311 coupled together as shown in FIG. 3. Master latch 205 forms part of the test path through master slave latch 200. The output end of inverting amplifier 311 provides the output of master latch 205.

Multiplexer 215, namely M1, includes input inverting amplifiers 321, 322 and transistors 323-328 coupled together as shown in FIG. 3. Multiplexer 215 includes BYPASS_DATA input 200B and SET input 200C. Multiplexer 215 also includes SEL_RAM ports that control which of inputs BYPASS DATA and SET couple through to the output of multiplexer 215 as the L2_IN signal. When master slave latch 200 operates in functional mode, SET input 200C receives data from RAM array 130. Latch 200 stores one bit of a multi-bit search result therein. Multiplexer 215 forms part of the functional path through master slave latch 200 when that latch operates in the functional mode, namely the high speed data transport mode discussed above.

Multiplexer 220, namely M2, includes inverting amplifiers 331-339 and transistors 341-348 coupled together as shown. When master slave latch 200 operates in test mode, multiplexer 220 receives the L1_OUT signal at its L1_OUT input and passes that signal to the L2_INT_C output of multiplexer 220. However, when multiplexer 220 operates in functional mode, multiplexer 220 receives the L2_IN signal from multiplexer 215 and passes that signal to the L2_INT_C output of multiplexer 220. The resultant L2_INT_C signal drives slave latch 210 and inverting amplifier 225.

Slave latch 210, namely L2, includes transistors 351-354 coupled together as shown. Latch 210 latches the L2_INT_C signal that it receives at its input when master slave latch 200 operates in either of test mode or functional mode.

Inverting amplifier 225 includes transistors 361 and 362 coupled together as shown. Inverting amplifier 225 drives the output 200D of master slave latch 200.

Figure 4:
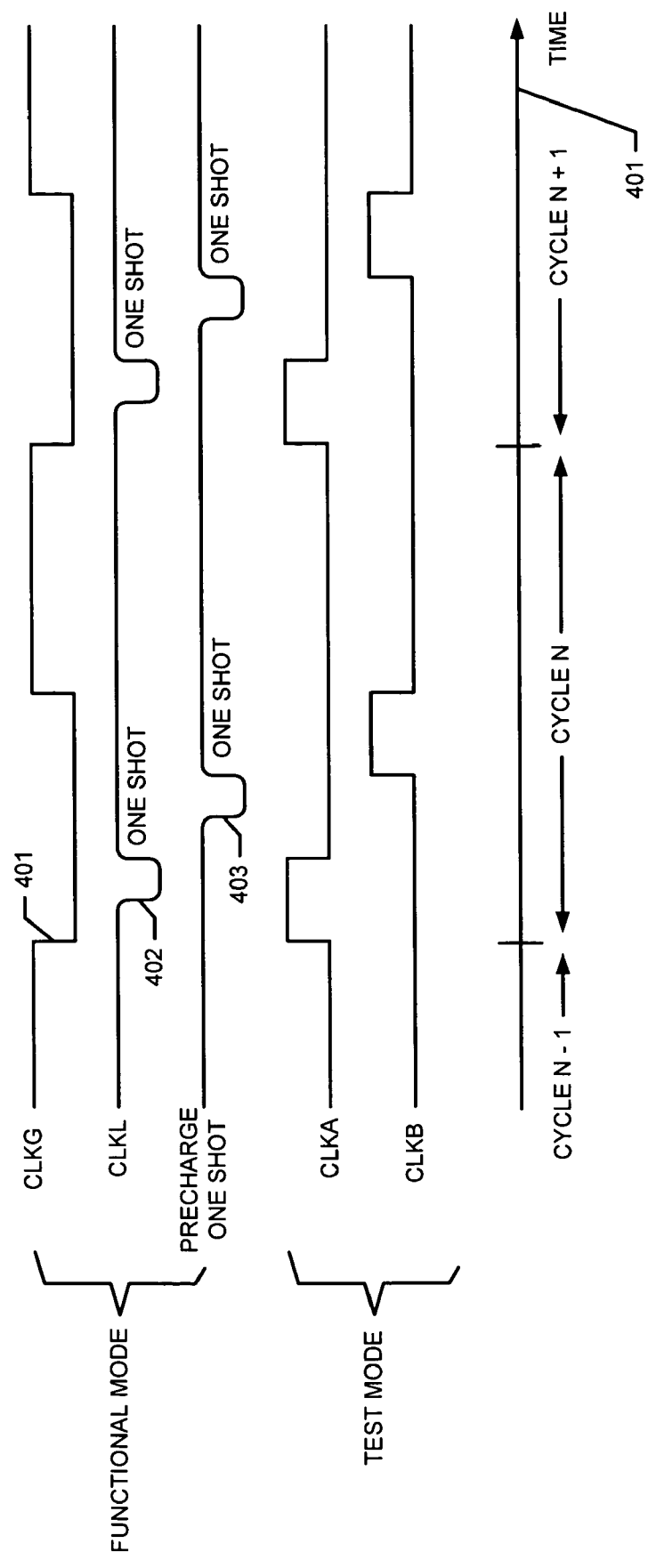
FIG. 4 is a timing diagram of signals employed in the cycle boundary latch of FIG. 2.

FIG. 4 shows timing diagrams for signals that control master slave latch 200 of FIG. 2 and FIG. 3. These timing signals determine whether master slave latch 200 latches data in a high speed functional mode or a lower speed test mode. The timing diagram of FIG. 4 shows time on the x axis 401, namely a current CAM cycle designated CYCLE N, a previous CAM cycle designated CYCLE N−1, and a next CAM cycle designated CYCLE+1. Although both test mode and functional mode clocks are shown in FIG. 4 to operate at the same cycle time, this can occur only at a frequency much lower than the maximum functional frequency. It is thus best to consider the test mode clocks and functional mode clocks to be operative at different frequencies. The functional mode clocks can be substantially faster than the test mode clocks depending on the particular application.

CAM system 100 places the master slave latch, namely CBL 200, in functional mode in the following manner. In functional mode, CAM system 100 provides a global clock, CLKG, dependent on the main clock signal of main clock 135 of FIG. 1. CLKG exhibits a falling edge at 401 in CYCLE N. Dependent on falling edge 401, CAM system 100 transitions CLKL low at falling edge 402, for example by generating a one shot pulse as shown in the CLKL waveform of FIG. 4. This one shot pulse activates the functional path through the master slave latch, namely CBL 200. More specifically, the falling edge 402 of CLKG activates the L2_IN input of multiplexer 220 so that data from RAM array 130 of CAM system 100 passes from latch input 200B through multiplexer 215 and through multiplexer 220 to multiplexer 220 output L2_INT_C. To make passing the data through multiplexer 215 possible in functional mode, the SEL_RAM signal instructs multiplexer 215 to pass signals from its SET input. Also dependent on falling edge 401, CAM system 100 transitions the PRECHARGE ONE SHOT low at falling edge 403, for example by generating a one shot pulse as shown in the PRECHARGE ONE SHOT waveform of FIG. 4. The function of the precharge one-shot is to precharge the SET node low during the precharge time associated with CAM array 110. This node then either stays low or evaluates to a high state after precharge and before the end of the cycle. Precharging occurs after the CLKL one shot pulse 402 launches the data from the previous cycle and has transitioned to a closed or opaque state. In functional mode, CLKA and CLKB are off or disabled at ground potential. With CLKA and CLKB thus disabled, CAM system 100 does not clock latch 205 and the L1_OUT input of multiplexer 220 remains unselected. These two actions effectively remove master latch 205 from the circuit when latch 200 operates in functional mode. Thus, latch 200 provides a very high speed path from input 200B through multiplexers 215 and 220 to output 200D without the delay associated with passing through latch 205.

CAM system 100 places the master slave latch, namely CBL 200, in test mode in the following manner. In test mode, CAM system 100 activates clock signals CLKA and CLKB to toggle orthogonally as shown the lowermost portion of FIG. 4. CAM system 100 turns CLKL off, thus decoupling multiplexer 215 from multiplexer 220. With CLKA and CLKB now active and toggling, master latch 205 becomes activated and multiplexer 220 passes the latched signal at the L1_OUT input of multiplexer 220 to the output of multiplexer 220. This action provides the signal from the output of multiplexer 220 to node 230, slave latch 210 and inverting amplifier. 225. In this manner, test data provided by CAM system 100 to the TEST DATA input 200A of CBL 200 propagates in test mode through the path formed by input 200A, master latch 205, multiplexer 220, slave latch 210 and inverting amplifier 205 to output 200D.

A cycle boundary latch exhibiting a high speed functional path and a lower speed test path is thus provided. One use for such a cycle boundary latch is in the cycle boundary output latch array of a content addressable memory (CAM) system.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of operating a cycle boundary latch (CBL) comprising:
   providing a master latch coupled to a slave latch;
   transmitting test data, from a test data input via the master and slave latches to a CBL output, thus defining a test mode of operation;
   transmitting other data, from another data input, through the CBL to the CBL output via a path that bypasses the master latch, thus defining a functional mode of operation;
   wherein transmitting the test data comprises transmitting the test data via the master latch to a first input of a switch including the first input, a second input and a switch output that communicates with the CBL output;
   wherein transmitting the other data comprises transmitting the other data to the second input of the switch;
   instructing the switch to select the test data at the first input and supply the first data to the switch output, wherein a first clock signal performs the instructing of the switch to select the test data; and
   instructing the switch to select the other data at the second input and to supply the other data to the switch output, wherein a second clock signal performs the instructing of the switch to select the other data.

2. A cycle boundary latch (CBL) comprising:
   a master latch including a master latch input to which test data is supplied, the master latch also including a master latch output;
   a switch including a first switch input, to which other data is supplied, and further including a second switch input coupled to the master latch output, and further including a switch output;
   a slave latch including a slave latch input coupled to the switch output, the slave latch being coupled to a CBL output;
   wherein the switch includes a first clock input that when supplied a first clock signal exhibiting a first logic state causes the switch to couple the first switch input to the switch output so that the other data flows to the switch output and the CBL output, thus defining a functional mode of operation of the CBL;
   wherein the switch includes a second clock input that when supplied a second clock signal exhibiting a first logic state causes the switch to couple the second switch input to the switch output so that the test data flows to the switch output and the CBL output, thus defining a test mode of operation of the CBL.

3. The CBL of claim 2 wherein the second clock input is supplied with a second clock signal exhibiting a second logic state thus effectively disabling the master latch and allowing the other data to flow through the CBL to the CBL output.

4. The CBL of claim 3 wherein the other data exhibits a speed substantially greater than the test data.

5. The CBL of claim 3 wherein the master latch includes a clock input that when supplied a third clock signal exhibiting a first logic state causes the master latch to pass test data therethrough.

6. The CBL of claim 5 wherein the master latch stops passing test data therethrough when the third clock signal exhibits a second logic state.

* * * * *